(12) United States Patent
Sogabe et al.

(10) Patent No.: US 7,697,585 B2
(45) Date of Patent: Apr. 13, 2010

(54) SEMICONDUCTOR LASER DIODE (75) Inventors: Ryuichi Sogabe, Mihara (JP);
Yoshinobu Kawaguchi, Mihara (JP);
Takeshi Kamikawa, Mihara (JP)

(73) Assignee: Sharp Kabushiki Kaisha, Osaka (JP)

(*) Notice: Subject to any disclaimer, the term of this patent is extended or adjusted under 35 U.S.C. 154(b) by 0 days.

(21) Appl. No.: 11/651,074

(22) Filed: Jan. 9, 2007

(65) Prior Publication Data
US 2007/0177646 A1 Aug. 2, 2007

(30) Foreign Application Priority Data
Jan. 30, 2006 (JP) ............... 2006-021144

(51) Int. Cl.
*H01S 5/00* (2006.01)
(52) U.S. Cl. .................................. 372/49.01
(58) Field of Classification Search ............... 372/49.01
See application file for complete search history.

(56) References Cited
U.S. PATENT DOCUMENTS
6,495,251 B1* 12/2002 Arbab et al. ............... 428/336

2003/0210722 A1* 11/2003 Arakida et al. ............... 372/49
2004/0099857 A1* 5/2004 Song et al. .................. 257/12
2004/0188688 A1* 9/2004 Muranaka .................... 257/72

FOREIGN PATENT DOCUMENTS

| CN | 1287684 | 3/2001 |
|----|---------|--------|
| EP | 1043765 A1 | 10/2000 |
| JP | 03-209895 A | 9/1991 |
| JP | 09-326527 A | 12/1997 |
| JP | 2003-264333 A | 9/2003 |

* cited by examiner

*Primary Examiner*—Minsun Harvey
*Assistant Examiner*—Patrick Stafford
(74) *Attorney, Agent, or Firm*—Morrison & Foerster LLP (57) ABSTRACT

A semiconductor laser diode comprising a semiconductor substrate having an active layer with a pair of cavity facets opposed to each other on both ends of active layer as well as a first dielectric film of an oxide and a second dielectric film of an oxynitride successively stacked on one cavity facet has sufficient initial characteristics with a film structure having excellent heat radiability for allowing stable high-output lasing over a long period without reducing a catastrophic optical damage level on an emission end.

7 Claims, 5 Drawing Sheets

SEMICONDUCTOR LASER DIODE

This nonprovisional application is based on Japanese Patent Application No. 2006-021144 filed with the Japan Patent Office on Jan. 30, 2006, the entire contents of which are hereby incorporated by reference.

BACKGROUND OF THE INVENTION

1. Field of the Invention

The present invention relates to an end emission type semiconductor laser diode, and more specifically, it relates to a semiconductor laser diode stably operating with a high output over a long time while suppressing aged deterioration of an emission end resulting from reduction of a catastrophic optical damage level.

2. Description of the Background Art

When the quantity of current injection is increased in an end emission type semiconductor laser diode of the 650 nm band or the 780 nm band in order to increase the light output, the light output is abruptly reduced to stop lasing. This phenomenon, resulting from catastrophic optical damage (hereinafter abbreviated as COD) to an emission end of the semiconductor laser diode, is conceivably caused through the following mechanism: When current is injected into the semiconductor laser diode, non-radiative recombination current flows through high-density surface levels present on the emission end due to the presence of an oxide or the like. Therefore, the carrier concentration is reduced on the emission end as compared with that in the semiconductor laser diode, leading to light absorption. The semiconductor laser diode generates heat by this light absorption to increase the temperature on the emission end, whereby the bandgap energy on the emission end is reduced to further increase light absorption. This positive feedback loop so extremely increases the temperature of the emission end that the emission end is finally melted to stop lasing.

The COD level of a recent high-output semiconductor laser diode can be increased by disordering an emission end through a window structure for increasing bandgap energy of the disordered emission end and reducing the level of light absorption resulting from surface levels. When the semiconductor laser diode having such a window structure is oscillated over a long period, however, the COD level is disadvantageously reduced due to aged deterioration.

In order to obtain a high COD level, therefore, the temperature of the emission end must be reduced by improving heat radiability of the semiconductor laser diode. In this point of view, various proposals have been made in general.

For example, Japanese Patent Laying-Open No. 03-209895 (1991) (Patent Literature 1) describes that a function of an excellent end protective film can be ensured in a semiconductor laser diode of the 780 nm band having an $Al_xO_yN_z$ film (x+y+z=1) formed as a first dielectric film with an AlGaAs active layer by forming a single $Al_xO_yN_z$ layer having a thermal expansion coefficient close to that of AlGaAs forming the active layer while ensuring heat radiability.

Japanese Patent Laying-Open No. 2003-264333 (Patent Literature 2) discloses a technique of solving such a problem that particles easily adhere to an SiN film exposed on a surface to deteriorate chemical resistance by stacking a first dielectric film of $Al_2O_3$, a second dielectric film of $Si_3N_4$ or AlN and a third dielectric film of $Al_2O_3$ with each other thereby covering the surfaces of the $Si_3N_4$ or AlN film with the $Al_2O_3$ films on the basis of the idea disclosed in Japanese Patent Laying-Open No. 09-326527 (1997) (Patent Literature 3).

SUMMARY OF THE INVENTION

The COD level of the semiconductor laser diode according to the aforementioned Patent Literature 1 is not more than 200 mW when the $Al_xO_yN_z$ film is directly formed, and this COD level is disadvantageously low as that of a laser diode of not more than 300 mW. This conceivably results from nitriding of a semiconductor interface. It is known that GaAsN has a smaller bandgap than GaAs, and GaAsN formed by nitriding a surface of GaAs conceivably results in light absorption. In the structure obtained by directly forming the $Al_xO_yN_z$ film, further, the thermal expansion coefficient of the $Al_xO_yN_z$ film, which is close to that of the AlGaAs film forming the active layer, is remarkably different from that of GaAs employed for a substrate forming the base of the semiconductor laser diode. Therefore, adhesiveness between the semiconductor interface and the dielectric film is so inferior that the yield is reduced due to a problem such as film separation.

According to Patent Literature 2, the first dielectric film of $Al_2O_3$, the second dielectric film of $Si_3N_4$ or AlN and the third dielectric film of $Al_2O_3$ are stacked with each other so that the $Al_2O_3$ films protect the $Si_3N_4$ film inferior in chemical resistance by holding the same therebetween. However, the thermal expansion coefficient of the $Si_3N_4$ or AlN film is disadvantageously remarkably different from that of a GaAs-based material. When a film having a thickness of at least 50 nm is formed, therefore, film separation remarkably results from the difference between the thermal expansion coefficients of the first dielectric film of $Al_2O_3$ and the second dielectric film of SiN to disadvantageously reduce the production yield, regardless of film forming conditions.

In the technique disclosed in Patent Literature 2, further, the first dielectric film has a large thickness of 5 nm to 100 nm and hence the nitride film having excellent heat radiability is separated from an emission end of the semiconductor laser diode. Upon lasing over a long period, therefore, the temperature of the emission end rises to progress end oxidation, to disadvantageously result in formation of high-density surface levels, facilitation of light absorption and aged deterioration of the COD level. In addition, stress is hardly reduced due to the difference between the thermal expansion coefficients of the materials forming the $Al_2O_3$ films and the AlN or SiN film, and it is difficult to thickly form the film having excellent heat radiability.

It is conceivable that none of the semiconductor laser diodes having the aforementioned structures can satisfy sufficient reliability and a sufficient COD level meeting marketing needs for a high-output laser diode.

The present invention has been proposed in order to solve the aforementioned problems, and an object of the present invention is to provide a semiconductor laser diode having sufficient initial characteristics, capable of stable high-output lasing over a long period with no reduction of a catastrophic optical damage level on an emission end through a film structure having excellent heat radiability.

The semiconductor laser diode according to the present invention comprises a semiconductor substrate having an active layer with a pair of cavity facets opposed to each other on both ends of the active layer, and a first dielectric film of an oxide and a second dielectric film of an oxynitride successively stacked on one of the cavity facets.

According to the present invention, a semiconductor laser diode ensuring reliability by improving adhesiveness between a first dielectric film and a second dielectric film higher in thermal conductivity than the first dielectric film, preventing reduction of a COD level resulting from film separation or surface nitriding and suppressing deterioration of an emission end resulting from catastrophic optical damage caused upon a high-output operation over a long time can be implemented by providing a laminated structure of the first dielectric film of an oxide and the second dielectric film of an oxynitride on one (emission end) of a pair of cavity facets.

According to the present invention, the first dielectric film is preferably made of aluminum oxide.

According to the present invention, the thickness of the first dielectric film is preferably 3 to 20 nm.

According to the present invention, the second dielectric film is preferably made of aluminum oxynitride, and the oxygen content in this aluminum oxynitride is preferably 3 to 20%.

According to the present invention, the thickness of the second dielectric film is preferably 30 to 100 nm.

The semiconductor laser diode according to the present invention preferably further includes a third dielectric film of an oxide stacked on the second dielectric film.

According to the present invention, the third dielectric film is preferably made of at least any material selected from aluminum oxide, silicon oxide, tantalum oxide, hafnium oxide, zirconium oxide, titanium oxide, niobium oxide, aluminum oxynitride, silicon oxynitride and silicon nitride.

According to the present invention, the thickness of the third dielectric film is preferably at least 20 nm.

In the semiconductor laser diode according to the present invention, the second dielectric film is preferably made of an oxynitride prepared from a target of aluminum oxide ($Al_xO_y$, ($0<x<1$, $0<y<0.6$)) in an ECR sputtering apparatus.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1A:
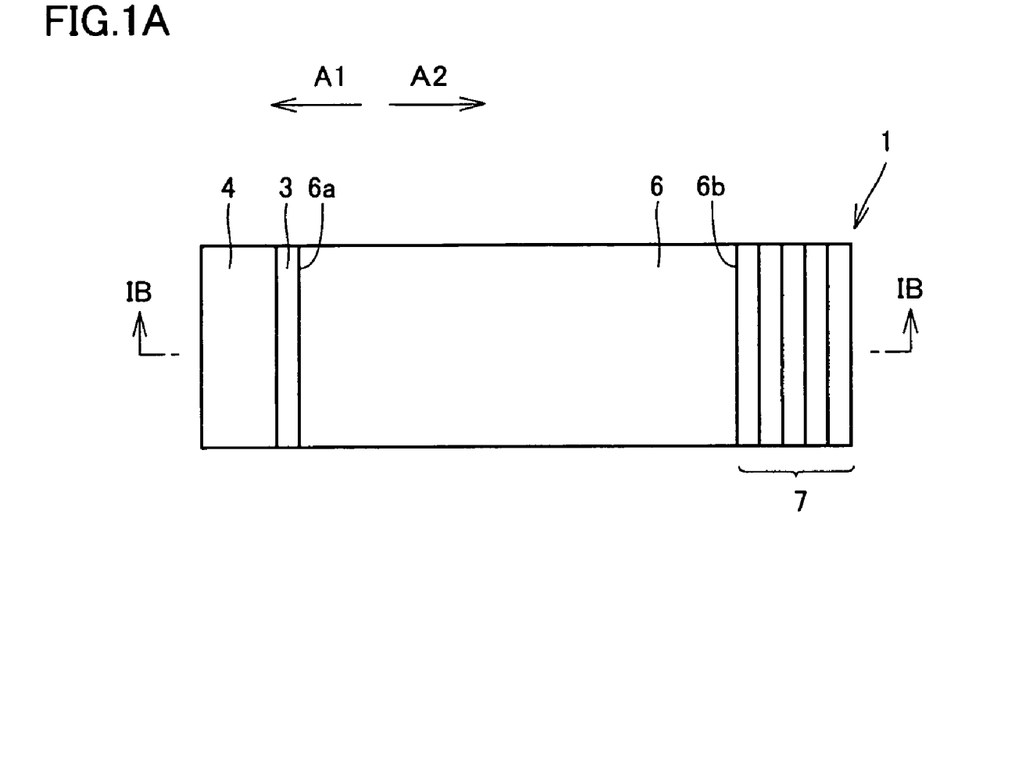
FIG. 1A is a top plan view schematically showing a semiconductor laser diode 1 according to a first preferred embodiment of the present invention.
Figure 1B:
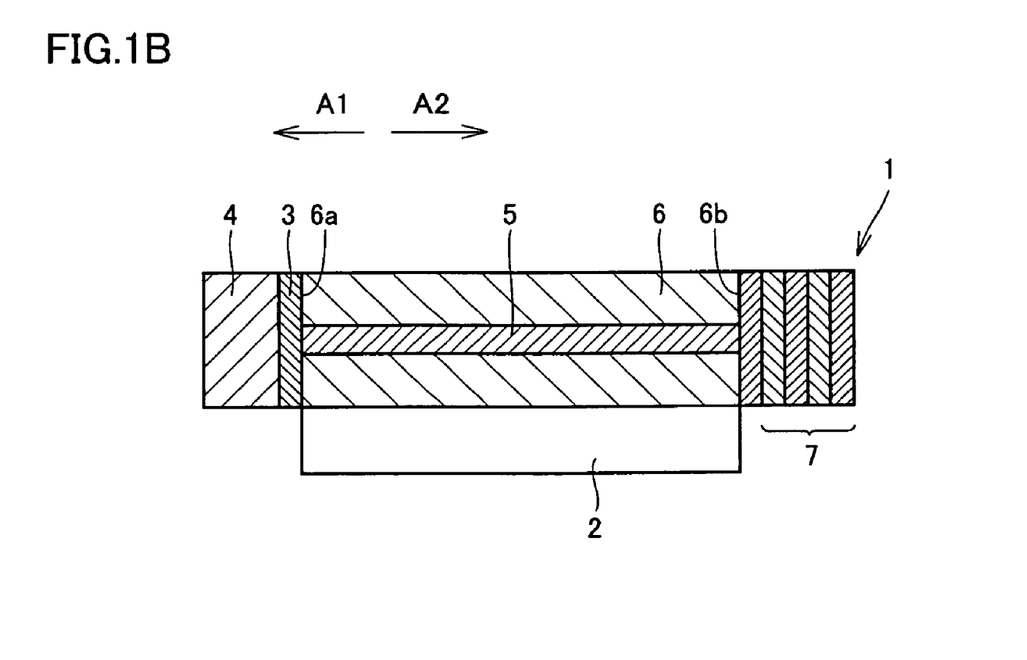
FIG. 1B is a sectional view schematically showing semiconductor laser diode 1 according to the first preferred embodiment of the present invention.

FIG. 1A is a top plan view schematically showing a semiconductor laser diode 1 according to a first preferred embodiment of the present invention, and FIG. 1B is a sectional view of semiconductor laser diode 1 taken along the line IB-IB in FIG. 1A. Semiconductor laser diode 1 according to this embodiment comprises a basic structure prepared by forming a plurality of semiconductor layers (illustrated in a partially omitted manner in FIG. 1B) including an active layer 5 on the main surface of a semiconductor substrate 2 for forming a cavity 6 with a pair of cavity facets 6a and 6b opposed to each other on both ends of active layer 5. Semiconductor laser diode 1 according to this embodiment further comprises first and second dielectric films 3 and 4 successively stacked on cavity facet 6a formed on a first side A1 (light emission side of semiconductor laser diode 1). Semiconductor laser diode 1 according to this embodiment is implemented by a structure obtained by forming a prismatic substance (cavity 6) having two opposite surfaces on semiconductor substrate 2 so that the first one (facet 6a on first side A1 in the embodiment shown in FIGS. 1A and 1B) of the two surfaces serves as a light-emitting end and the second surface (facet 6b on a second side A2 in the embodiment shown in FIGS. 1A and 1B) serves as a light-reflecting end.

In semiconductor laser diode 1 according to this embodiment, first dielectric film 3 is made of an oxide. According to the present invention, the "oxide" also includes an oxynitride, and is prepared from aluminum oxide ($Al_2O_3$), aluminum oxynitride ($Al_xO_yN_z$) silicon oxide (SiO, $SiO_2$ or $Si_2O_3$), tantalum oxide ($Ta_2O_5$), zirconium oxide ($ZrO_2$) or silicon oxynitride ($Si_xO_yN_z$), for example.

In particular, first dielectric film 3 is preferably prepared from aluminum oxide having a thermal expansion coefficient of 7.2 ($\times 10^{-6}$)/° C. close to that (6.8 ($\times 10^{-6}$)/° C.) of GaAs in the range of about ±5% so that the $Al_2O_3$ film has high adhesiveness with respect to cavity facet 6a with transparency over a wide wave range and is thermally and chemically stable not to easily react with compound semiconductor crystals.

Alternatively, first dielectric film 3 is preferably prepared from aluminum oxynitride having a nitrogen content of 1 to 10% so that the thermal conductivity thereof can be improved as compared with that of aluminum oxide for contributing to improvement of heat radiability. If the nitrogen content in aluminum oxynitride exceeds 10%, however, the COD level may be reduced due to nitriding of a semiconductor interface.

Upon lasing over a long period, an emission end of a semiconductor laser diode is deteriorated by aged COD due to temperature rise resulting from reduction of carrier concentration and following light absorption on the emission end, as hereinabove described. In this regard, the inventors have recognized that it is effective to suppress local temperature rise on the emission end by increasing thermal conductivity of a dielectric film formed on the emission end and improving heat radiability, in order to prevent aged deterioration of the COD level. In consideration of heat radiability, therefore, it is seemingly better to prepare a first dielectric film from AlN having higher thermal conductivity than $Al_2O_3$ than to prepare the same from $Al_2O_3$. In a GaAs-based semiconductor laser diode, however, it is difficult to bring an AlN film into close contact With an emission end due to stress and difference between the thermal expansion coefficients thereof. Thus, the inventors have found that first oxide film 3 directly formed on emission end 6a of cavity 6 must be made not of AlN but of the aforementioned oxide (preferably Al$_2$O$_3$) having a thermal expansion coefficient close to that of cavity 6 for maintaining high adhesiveness with respect to emission end 6a of cavity 6.

In semiconductor laser diode 1 according to this embodiment, the thickness of first dielectric film 3, not particularly restricted, is preferably 3 to 20 nm, more preferably 5 to 10 nm. In this case, the term "thickness" denotes the average thickness of first dielectric film 3 obtained by measuring the thickness of a section of first dielectric film 3 in the vicinity of an end of semiconductor laser diode 1 with an electron microscope (TEM or SEM), for example.

Figure 2:
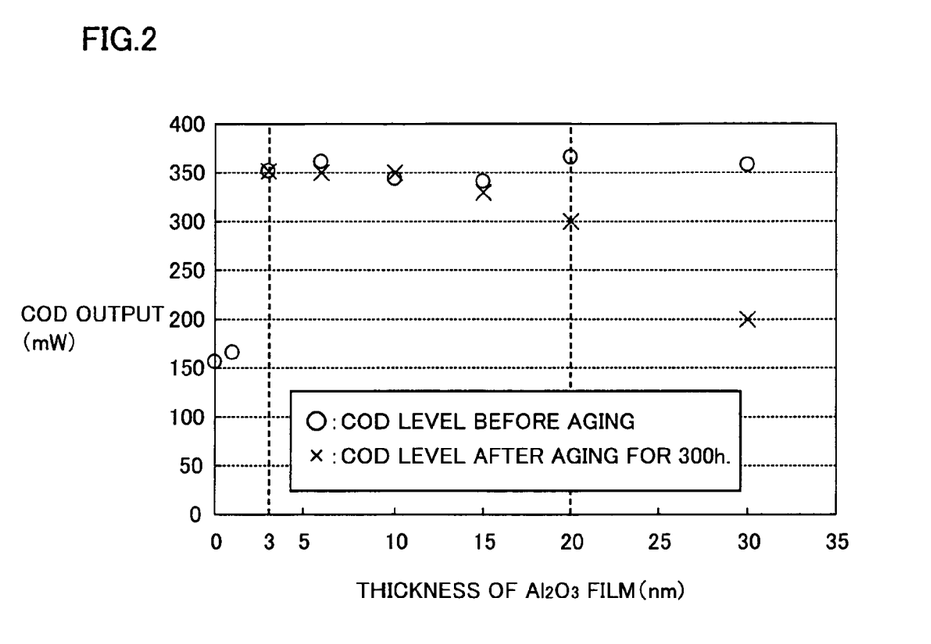
FIG. 2 is a graph showing the relation between the thickness of a first dielectric film of $Al_2O_3$ and the COD output (mW) of a semiconductor laser diode.

The relation between the thickness of first dielectric film 3 and aged deterioration of emission end 6a resulting from COD upon lasing over a long period is now described. FIG. 2 is a graph showing the relation between the thickness of first dielectric film 3 formed by an Al$_2$O$_3$ film and the COD output (mW) of semiconductor laser diode 1. The COD output of semiconductor laser diode 1 corresponds to the maximum light output (mW) detected with a photodiode by destroying five semiconductor laser diodes with COD and applying current up to stoppage of lasing.

On the basis of the aforementioned recognition, the inventors have obtained the thickness of first dielectric film 3 necessary for protecting cavity facet 6a while ensuring heat radiability. The graph of FIG. 2 shows the results. As shown in FIG. 2, the COD level is at a low value of about 150 mW when the thickness of the Al$_2$O$_3$ film is less than 3 nm. This is conceivably because the thickness of the Al$_2$O$_3$ film is so excessively small that a semiconductor crystal interface is nitrided in formation of a second dielectric film. From the results shown in FIG. 2, it is understood preferable to set the minimum thickness of the first dielectric film of Al$_2$O$_3$ serving as a protective film against nitriding in formation of the second dielectric film to 3 nm.

FIG. 2 also shows COD levels (shown by ○ in FIG. 2) of Al$_2$O$_3$ films having thicknesses of 6 nm, 10 nm, 20 nm and 30 nm respectively and COD levels (shown by X in FIG. 2) after lasing with a pulse of 300 mW for 300 hours. It is understood from the results shown in FIG. 2 that heat radiability of the Al$_2$O$_3$ film can be ensured if the thickness thereof is not more than 20 nm. If the thickness of the Al$_2$O$_3$ film exceeds 20 nm, the distance between the end of the semiconductor laser diode and the second dielectric film having excellent heat radiability as described later is excessively increased to deteriorate heat radiability of the overall diode, conceivably leading to reduction of the COD level upon lasing over a long period.

Second dielectric film 4 of semiconductor laser diode 1 according to this embodiment is made of an oxynitride. The oxynitride employed for forming second dielectric film 4 can be prepared from aluminum oxynitride (Al$_x$O$_y$N$_z$) or silicon oxynitride (Si$_x$O$_y$N$_z$). In particular, second dielectric film 4 is preferably prepared from aluminum oxynitride capable of maintaining high adhesiveness with first dielectric film 3 due to high heat radiability and a thermal expansion coefficient close to that of first dielectric film 3.

On the basis of the aforementioned recognition that it is effective to improve heat radiability by increasing thermal conductivity of the dielectric film formed on the emission end and to suppress local temperature rise in the vicinity of the emission end in order to prevent aged deterioration of the COD level, the inventors have used an Al$_2$O$_3$ film generally employed as an end protective film of a semiconductor laser diode and tried to stack an AlN film having higher thermal conductivity than the Al$_2$O$_3$ film on the first dielectric film as a second dielectric film for improving thermal conductivity of the first dielectric film. However, the AlN film formed on the Al$_2$O$_3$ film was inferior in adhesiveness with the Al$_2$O$_3$ film due to stress and difference between the thermal expansion coefficients thereof, such that the COD level was reduced due to film separation and abrupt oxidation of the AlN film when the semiconductor laser diode was oscillated over a long period.

Figure 3:
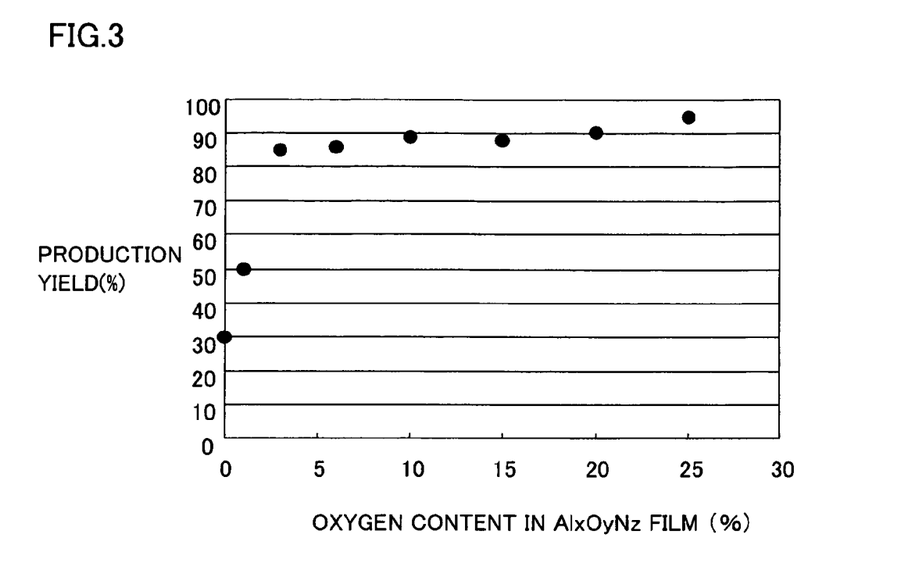
FIG. 3 is a graph showing the relation between the oxygen content (%) in AlN forming an $Al_xO_yN_z$ film and a production yield (%)

Therefore, the inventors have tried to absorb the difference between the thermal expansion coefficients of the AlN film and the Al$_2$O$_3$ film by employing Al$_x$O$_y$N$_z$ prepared by mixing oxygen into AlN so that the AlN film was close to the Al$_2$O$_3$ film in physical property. FIG. 3 is a graph showing the relation between the oxygen content (%) in AlN of an Al$_x$O$_y$N$_z$ film and the production yield (%). The production yield (%) was obtained by observing emission ends of GaAs-based laser diodes formed by successively stacking first dielectric films of Al$_2$O$_3$ (thickness: 6 nm), second dielectric films of Al$_x$O$_y$N$_z$ (thickness: 50 nm) and third dielectric films (described later) of Al$_2$O$_3$ (thickness: 80 nm) on the emission ends and regarding those having visually observed cracks and/or peelings as defectives.

As obvious from FIG. 3, cracks and/or peelings reducing the production yield were remarkably observed when the second dielectric film was made of AlN (oxygen content: 0%). It has been confirmed through observation with an optical microscope that these cracks and/or peelings were caused between the first dielectric film of Al$_2$O$_3$ and the second dielectric film of AlN. On the other hand, it has been recognized that reduction of the production yield resulting from film separation or the like can be prevented if the oxygen content in AlN forming the Al$_x$O$_y$N$_z$ film is at least 3%. This is conceivably because the thermal expansion coefficient of the Al$_x$O$_y$N$_z$ film having the oxygen content of at least 3% is closer to that of Al$_2$O$_3$ as compared with that of an AlN film. This is also conceivably because adhesiveness between the Al$_2$O$_3$ film and the Al$_x$O$_y$N$_z$ film was improved due to the oxygen introduced into AlN.

Figure 4:
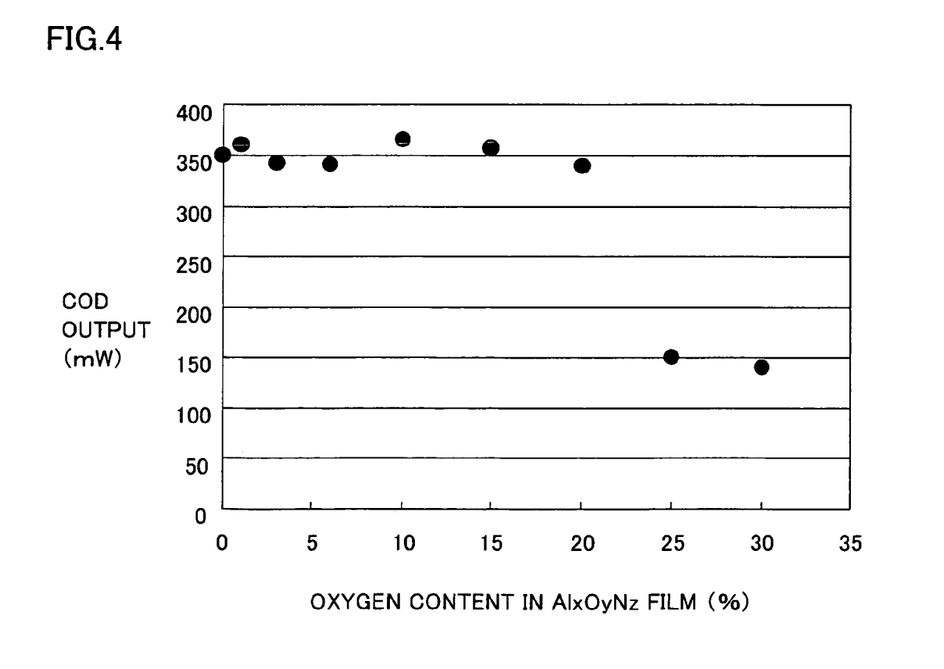
FIG. 4 is a graph showing the relation between the oxygen content (%) in AlN forming an $Al_xO_yN_z$ film and a COD output (mW)

FIG. 4 is a graph showing the relation between the oxygen content (%) in a second dielectric film of Al$_x$O$_y$N$_z$ in a GaAs-based laser diode obtained by successively stacking a first dielectric film of Al$_2$O$_3$ (thickness: 6 nm), the second dielectric film of Al$_x$O$_y$N$_z$ (thickness: 50 nm) and a third dielectric film (described later) of Al$_2$O$_3$ (thickness: 80 nm) on an emission end and a COD output (mW) after aging for 300 hours. The COD level was measured similarly to the above.

It is understood from FIG. 4 that the COD level is reduced after lasing at 300 mW for 300 hours if the oxygen content in the Al$_x$O$_y$N$_z$ film exceeds 20%. This is inferably because the Al$_x$O$_y$N$_z$ film so characteristically approaches the Al$_2$O$_3$ film that the thermal conductivity is reduced if the aforementioned oxygen content exceeds 20%.

From the aforementioned point of view, second dielectric film 4 employed for semiconductor laser diode 1 according to this embodiment is preferably prepared from aluminum oxynitride having an oxygen content in the range of 3 to 20%, more preferably in the range of 5 to 10%. The oxygen content of in Al$_x$O$_y$N$_z$ film forming second dielectric film 4 of semiconductor laser diode 1 can be measured by TEM-EDX (transmission electron microscopy-energy dispersive X-ray spectroscopy).

Throughout the specification, Al$_x$O$_y$N$_z$ may be prepared by mixing Al$_2$O$_3$ into AlN, introducing AlON crystals into AlN or introducing Al$_2$O$_3$ or AlON into AlN. According to the present invention, Al$_x$O$_y$N$_z$ may be in any of the aforementioned modes so far as the oxygen content y in the Al$_x$O$_y$N$_z$ film is within the aforementioned range.

In semiconductor laser diode 1 according to this embodiment, the thickness of second dielectric film 4, not particularly restricted, is preferably 30 to 100 nm, more preferably 40 to 50 nm. This thickness, denoting the average thickness of second dielectric film 4, can be measured by a method similar to the aforementioned one for measuring the thickness of first dielectric film 3.

Figure 5:
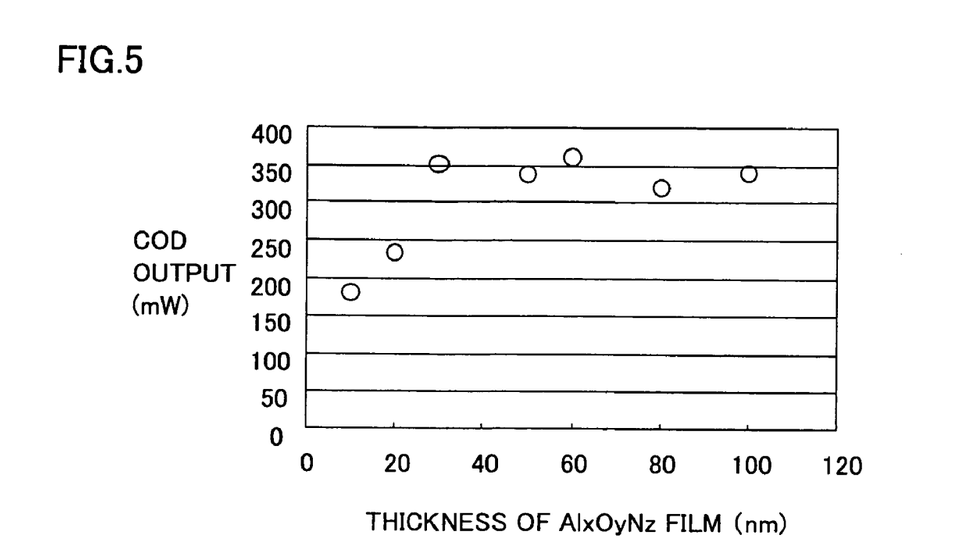
FIG. 5 is a graph showing the relation between the thickness of a second dielectric film of $Al_xO_yN_z$ and a COD output (mW)

FIG. 5 is a graph showing the relation between the thickness of a second dielectric film of $Al_xO_yN_z$ formed on a first dielectric film of $Al_2O_3$ (thickness: 6 nm) provided on an emission end of a GaAs-based laser diode and a COD output after aging for 300 hours. The COD level was measured similarly to the above.

It is understood from FIG. 5 that heat radiability is insufficient and the COD level tends to cause aged deterioration by lasing with a pulse of 300 mW for 300 hours if the thickness of the $Al_xO_yN_z$ film is less than 30 nm. Adhesiveness with respect to the first dielectric film of $Al_2O_3$ tends to lower if the thickness of the $Al_xO_yN_z$ film exceeds 100 nm, and the $Al_xO_yN_z$ film is separated when the thickness exceeds 120 nm, in particular. This is conceivably because stress cannot be completely eliminated due to a problem of heat radiability if the thickness of the $Al_xO_yN_z$ film is too large, also when the $Al_xO_yN_z$ film is prepared by introducing oxygen into AlN to be close to the $Al_2O_3$ film in physical property. Therefore, it is inferred that the critical thickness of the $Al_xO_yN_z$ film employed as the second dielectric film is 120 nm.

As hereinabove described, a reliable semiconductor laser diode can be implemented by providing a laminated structure of a first dielectric film prepared from an oxide and a second dielectric film prepared from an oxynitride on one (emission end) of a pair of cavity facets thereby improving adhesiveness between the first dielectric film and the second dielectric film having higher thermal conductivity than the first dielectric film, preventing reduction of a COD level resulting from surface nitriding and suppressing deterioration of the emission end resulting from catastrophic optical damage (COD) upon a high-output operation over a long time. In relation to the adhesiveness between the first and second dielectric films, the most important factors are the thickness of and the oxygen content in an $Al_xO_yN_z$ film forming the second dielectric film. In this regard, the second dielectric film preferably has a thickness of not more than 100 nm and an oxygen content of not more than 3% while the first dielectric film preferably has a thickness in the range of 3 to 20 nm, in order to reliably prevent a problem such as film separation.

In the semiconductor laser diode according to the present invention, film separation or the like can be prevented by controlling the oxygen content in the $Al_xO_yN_z$ film, also when the thickness thereof is increased. Thus, the production yield of the semiconductor laser diode is improved.

Figure 6:
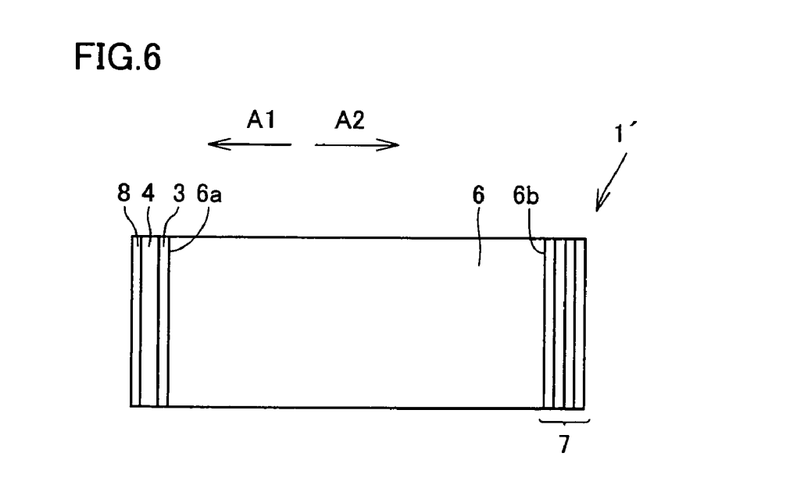
FIG. 6 is a top plan view schematically showing a semiconductor laser diode 1' according to a second preferred embodiment of the present invention.

FIG. 6 is a top plan view schematically showing a semiconductor laser diode 1' according to a second preferred embodiment of the present invention. Semiconductor laser diode 1' according to the embodiment shown in FIG. 6 is similar in structure to semiconductor laser diode 1 according to the embodiment shown in FIGS. 1A and 1B except that a third dielectric film 8 is further stacked on a second dielectric film 4. Therefore, portions of semiconductor laser diode 1' similar in structure to those of the first preferred embodiment are denoted by the same reference numerals, and redundant description is not repeated. Semiconductor laser diode 1' according to the present invention may further comprise third dielectric film 8 stacked on second dielectric film 4, as shown in FIG. 6.

As hereinabove described, the first and second dielectric films are preferably formed in thicknesses within the specific ranges respectively, in order to obtain particularly preferable characteristics. However, the semiconductor laser diode must have reflectivity of 3 to 10% (more preferably 5 to 7%) on the light-emitting end. The term "reflectivity" denotes that on the light-emitting end of the diode measured from the ratio between the intensity of light incident upon the light-emitting end of the semiconductor laser diode from a lamp such as a halogen lamp or a neon lamp and that of light reflected by the light-emitting end with a reflectivity measuring apparatus. If the thicknesses of the first and second dielectric films are fixed from the aforementioned point of view, it may be difficult to obtain a semiconductor laser diode having the aforementioned reflectivity. In this case, a third dielectric film may be further formed on the second dielectric film, so that the semiconductor laser diode has desired reflectivity.

Third dielectric film 8 formed on second dielectric film 4 as shown in FIG. 6 is preferably prepared from an oxide. More specifically, this oxide, also including an oxynitride as hereinabove described, is preferably prepared from at least one material selected from aluminum oxide ($Al_2O_3$), silicon oxide ($SiO_2$), tantalum oxide ($Ta_2O_5$), hafnium oxide ($HfO_2$), zirconium oxide ($ZrO_2$), titanium oxide ($TiO_2$), niobium oxide ($Nb_2O_5$), silicon oxynitride (SiON), aluminum oxynitride (film having an oxygen content different from that in the second dielectric film of $Al_xO_yN_z$) and silicon nitride (SiN). In particular, $Al_2O_3$ having high chemical and thermal stability is preferably employed for forming the third dielectric film, so that the emission end of the obtained semiconductor laser diode is prevented from damage in a chemical washing step and a thermal process.

According to the present invention, the thickness of the third dielectric film, not particularly restricted, is preferably properly selected with a period corresponding to the desired reflectivity since the aforementioned reflectivity on the end is periodically varied with the thickness of the dielectric film. When an $Al_2O_3$ film having a thickness of 6 nm and an $Al_xO_yN_z$ film having a thickness of 50 nm are formed as first and second dielectric films 3 and 4 respectively and another $Al_2O_3$ film is formed thereon as third dielectric film 8, the thickness of third dielectric film 8 can be arbitrarily set to 16 nm, 70 nm, 216 nm, 270 nm . . . in order to obtain end reflectivity of 6%, for example. This thickness, also denoting the average thickness of third dielectric film 8, can be measured by a method similar to the aforementioned ones for measuring the thicknesses of first and second dielectric films 3 and 4.

According to the present invention, the thickness of third dielectric film 8 is preferably at least 20 nm, more preferably 60 to 260 nm. If the thickness of third dielectric film 8 is less than 20 nm, it tends to be difficult to protect second dielectric film 4 against external damage and to control the reflectivity.

When third dielectric film 8 is formed, the reflectivity may be designed by properly combining the aforementioned materials with each other for forming a multilayer structure, for example. For example, $Al_2O_3$ and $SiO_2$ or $Ta_2O_5$ and $Al_2O_3$ may be combined with each other for forming third dielectric film 8 of a multilayer structure. In this case, it is assumed that the aforementioned thickness of third dielectric film 8 denotes the average of the thicknesses of the films forming third dielectric film 8 of the multilayer structure.

Semiconductor laser diode 1' according to the present invention may be implemented in a multilayer structure of oxynitrides by preparing first, second and third dielectric films 3, 4 and 8 from an $Al_2O_3$ film, an $Al_xO_yN_z$ film and another $Al_xO_yN_z$ film having an oxygen content different from that in second dielectric film 4. In this case, third dielectric film 8 is preferably prepared from an $Al_xO_yN_z$ film having a larger oxygen content than second dielectric film 4.

In semiconductor laser diode 1 according to the first preferred embodiment of the present invention, semiconductor substrate 2 is formed by a proper substrate generally widely employed in this field as a substrate for a semiconductor laser diode. For example, semiconductor substrate 2 can be formed by a GaAs semiconductor substrate.

The plurality of semiconductor layers including active layer 5 for allowing resonance/oscillation are formed on the main surface of semiconductor substrate 2 employed in the present invention, for forming cavity 6. When applied to a semiconductor laser diode, facet 6a of cavity 6 formed by the plurality of semiconductor layers is generally employed as the light-emitting end (emission end). When semiconductor substrate 2 is formed by an n-type GaAs substrate, an n-type $In_{0.5}(Ga_{0.3}Al_{0.7})_{0.5}P$ cladding layer (n=3 to $4 \times 10^{17}$ cm$^{-3}$) doped with Si, active layer 5, a p-type $In_{0.5}(Ga_{0.3}Al_{0.7})_{0.5}P$ cladding layer (p=$9 \times 10^{17}$ cm$^{-3}$) doped with Zn, a p-type $In_{0.5}Ga_{0.5}P$ energizable layer doped with Zn and a p-type GaAs cap layer doped with Zn are successively stacked on the main surface of semiconductor substrate 2, for example. Active layer 5 can be constituted of an $In_{0.5}(Ga_{0.5}Al_{0.5})_{0.5}P$ first light guide layer, an MQW active layer formed by an $In_{0.65}Ga_{0.35}P$ well layer and an $In_{0.5}(Ga_{0.5}Al_{0.5})_{0.5}P$ barrier layer and an $In_{0.5}(Ga_{0.5}Al_{0.5})_{0.5}P$ second light guide layer, for example. A ZnO film, for example, is formed on the aforementioned cap layer so that Zn is diffused into an intermediate portion of the n-type cladding layer by a method described later, thereby forming a window region.

The aforementioned layers are illustrated by way of example, and the semiconductor substrate employed in the present invention is not restricted to the above, as a matter of course. The thicknesses of the layers can be properly selected and set in response to desired characteristics of the semiconductor laser diode.

A method of manufacturing the semiconductor laser diode according to the present invention is not particularly restricted, but well-known methods of manufacturing semiconductor laser diodes can be properly combined with each other.

The aforementioned layers such as the cladding layers, the active layer, the energizable layer and the cap layer and a highly reflective multilayer film are formed on the semiconductor substrate employed for the semiconductor laser diode in proper order with proper thicknesses by metal organic chemical vapor deposition (MOCVD), for example.

Then, a striped resist material is formed on the cap layer to have an opening, for example, and employed as a mask for etching the cap layer by 200 to 400 nm by wet etching or the like. At this time, an etchant having selectivity for the cap layer and the energizable layer provided under the same is so employed as not to etch the energizable layer. For example, a mixed solution prepared by mixing $H_2SO_4$, $H_2O_2$ and $H_2O$ with each other in the ratios 1:2:20 may be employed as the etchant.

The cap layer may alternatively be dry-etched. When dry etching is employed, controllability for the quantity of etching is more improved as compared with wet etching so that the thickness of the cap layer can be more strictly controlled.

Then, the window region is formed. More specifically, a ZnO film is formed by sputtering, and the resist material employed as the mask and a portion of the ZnO film formed on the resist material are removed by lift-off with a resist releasing agent or the like. Thereafter annealing is performed at a temperature of at least 500° C. for diffusing Zn from the ZnO film up to an intermediate portion of the n-type cladding layer, thereby selectively forming the window region containing diffused Zn. In order to ensure difference ($\Delta \lambda$) of at least 50 nm between the photoluminescence (PL) wavelength of the formed window region and that of the remaining regions containing no Zn, the annealing temperature must be at least 520° C. from the relation between the annealing temperature for the GaAs cap layer having a thickness of 0.5 μm (unetched state) and the difference $\Delta \lambda$.

In the semiconductor laser diode according to the present invention, a highly reflective multilayer film 7 of a multilayer structure is generally formed on facet (light-reflecting end) 6b on second side A2 of cavity 6 formed on semiconductor substrate 2 (see FIGS. 1A, 1B and 6). Highly reflective multilayer film 7 can be formed by combining proper materials generally employed in this field with each other, and is not particularly restricted. For example, highly reflective multilayer film 7 may be formed by a multicoated oxide film of $Al_2O_3$, $SiO_2$ and $Ta_2O_5$.

In semiconductor laser diode 1 according to the present invention, the aforementioned first and second dielectric films 3 and 4 (as well as third dielectric film 8 as the case may be) are formed on facet (light-emitting end) 6a on first side A1 of cavity 6 formed on semiconductor substrate 2. According to the present invention, methods of manufacturing first, second and third dielectric films 3, 4 and 8 are not restricted but well-known methods of manufacturing semiconductor laser diodes can be properly combined with each other.

First, second and third dielectric films 3, 4 and 8 may be formed by evaporation without heating semiconductor substrate 2 set in a film forming apparatus. In order to improve the adhesiveness between first and second dielectric films 3 and 4, however, semiconductor substrate 2 is preferably heated for forming these films 3 and 4. In this case, the heating temperature is preferably at least 150° C., more preferably 200 to 400° C.

Semiconductor substrate 2 may be heated only in formation of second dielectric film 4 after first dielectric film 3 is formed without heating semiconductor substrate 2. Alternatively, all of first, second and third dielectric films 3, 4 and 8 may be formed while heating semiconductor substrate 2. Further alternatively, semiconductor substrate 2 may be heated only in formation of third dielectric film 8 after first and second dielectric films 3 and 4 are formed without heating semiconductor substrate 2.

Methods of forming first, second and third dielectric films 3, 4 and 8 are not particularly restricted but these films 3, 4 and 8 may be formed by sputtering such as ECR (electron cyclotron resonance) sputtering, CVD (chemical vapor deposition) or EB (electron beam) evaporation, for example. Among these methods, ECR sputtering, generally employed for coating on a cavity facet of a semiconductor laser diode in high density with low damage on a sample, capable of forming plasma in a high vacuum is preferably employable. The $Al_xO_yN_z$ film can be formed according to a principle similar to that for an AlN film. In other words, the $Al_xO_yN_z$ film can be formed by sputtering a metal Al target and arranging a sample in a plasma atmosphere containing nitrogen gas and oxygen gas. In this case, the oxygen content y in the $Al_xO_yN_z$ film can be varied with the ratio between the nitrogen gas and the oxygen gas.

Alternatively, the $Al_xO_yN_z$ film can be formed by reactive sputtering with a target of aluminum oxide ($Al_xO_y$, (0<x<1, 0<y<0.6)) while introducing oxygen into a film forming chamber. When oxygen is introduced into relatively oxidative Al, it is difficult to control the composition and reproducibility of a film having a small oxygen content y. When a target of aluminum oxide ($Al_xO_y$ (0<x<1, 0<y<0.6)) (oxidation state is set low) is employed while introducing only nitrogen into a film forming chamber without introduction of oxygen, a film having a low oxygen content can be relatively easily formed. A similar result can be obtained also when employing an $Al_xO_yN_z$ target.

The oxygen content y is varied with the degree of vacuum of the film forming chamber and the film forming temperature, whereby the composition can be varied with the film forming conditions. The oxygen content tends to be increased in inverse proportion to the degree of vacuum in the film forming chamber, and tends to be reduced in proportion to the film forming temperature in the film forming chamber.

Further alternatively, the $Al_xO_yN_z$ film can be formed by oxidizing the inner wall of the film forming chamber or bonding $Al_2O_3$ to the inner wall of the film forming chamber, thereafter introducing Ar gas and nitrogen gas into the film forming chamber and forming a film by sputtering or the like with an Al target, due to desorption of oxygen contained in $Al_2O_3$ adhering to the inner wall.

Thus, the $Al_xO_yN_z$ film can be formed by any method such as that obtained by combining the aforementioned methods with each other, and the method of forming the $Al_xO_yN_z$ film itself is not particularly restricted according to the present invention.

The semiconductor laser diode according to the present invention, preferably implementable as an end emission type red semiconductor laser diode of the 650 nm band employing a GaAs substrate as a semiconductor substrate, for example, is not restricted to this but is also applicable to a wide-ranging emission wavelength of 780 nm, 850 nm or 980 nm. Further, the semiconductor laser diode according to the present invention may be implemented in an air ridge structure or an embedded ridge structure.

While the composition of each dielectric film forming the semiconductor laser diode according to the present invention may differ from the ratios of the chemical formula due to stoichiometric deviation resulting from film forming conditions, it is assumed that the present invention includes also this case with no particular problem for the subject matter thereof.

While Examples are now described, the present invention is not restricted to these.

EXAMPLE 1

An n-type $In_{0.5}(Ga_{0.3}Al_{0.7})_{0.5}P$ cladding layer (n=3 to $4 \times 10^{17}$ cm$^{-3}$) having a thickness of 2.2 μm doped with Si, an active layer 5, a p-type $In_{0.5}(Ga_{0.3}Al_{0.7})_{0.5}P$ cladding layer (p=$9 \times 10^{17}$ cm$^{-3}$) having a thickness of 1.5 μm doped with Zn, a p-type $In_{0.5}Ga_{0.5}P$ energizable layer having a thickness of 50 nm doped with Zn and a p-type GaAs cap layer having a thickness of 0.5 μm doped with Zn were successively formed on an n-type GaAs substrate (semiconductor substrate) 2. Active layer 5 was formed by successively stacking an $In_{0.5}(Ga_{0.5}Al_{0.5})_{0.5}P$ first light guide layer having a thickness of 50 nm, an MQW active layer formed by an $In_{0.65}Ga_{0.35}P$ well layer having a thickness of 5 nm and an $In_{0.5}(Ga_{0.5}Al_{0.5})_{0.5}P$ barrier layer having a thickness of 6 nm and an $In_{0.5}(Ga_{0.5}Al_{0.5})_{0.5}P$ second light guide layer having a thickness of 50 nm. These layers were formed by metal organic chemical vapor deposition (MOCVD).

Then, a striped resist material was formed on an end surface of a laminated structure obtained in the aforementioned manner to have an opening of 20 μm with a thickness of 3.0 μm and employed as a mask for etching the GaAs cap layer by wet etching. A mixed solution prepared by mixing $H_2SO_4$, $H_2O_2$ and $H_2O$ with each other in the ratios 1:2:20 was employed as an etchant for this etching.

Then, a window region was formed. First, a ZnO film was formed by sputtering, and the resist material employed as the mask and a portion of the ZnO film formed on the resist material were removed by lift-off with a resist releasing agent or the like. Thereafter annealing was performed at a temperature of at least 520° C. for diffusing Zn from the ZnO film up to an intermediate portion of the n-type $In_{0.5}(Ga_{0.3}Al_{0.7})_{0.5}P$ cladding layer, thereby selectively forming the window region containing Zn diffused therein.

A first dielectric film 3 of $Al_2O_3$ (thickness: 6 nm), a second dielectric film 4 of $Al_xO_yN_z$ (thickness: 50 nm) and a third dielectric film 8 of $Al_2O_3$ (thickness: 70 nm) were successively stacked on a facet 6a of a cavity 6 formed in the aforementioned manner. A highly reflective multilayer film 7 had been previously formed on another facet 6b on a second side (light-reflecting side) of cavity 6 formed on semiconductor substrate 2 by a multicoated oxide film of $Al_2O_3$, $SiO_2$ and $Ta_2O_5$. A semiconductor laser diode 1' similar to that according to the embodiment shown in FIG. 6 was prepared in this manner.

First, second and third dielectric films 3, 4 and 8 were formed by ECR (electron cyclotron resonance) sputtering while keeping a film forming apparatus at the room temperature, more specifically at 25° C. According to Example 1, second dielectric film 4 of $Al_xO_yN_z$ was formed by feeding 5.5 sccm of nitrogen ($N_2$) gas and 1.0 sccm of oxygen ($O_2$) gas while feeding 20.0 sccm of argon (Ar) gas in order to efficiently generate plasma and increase the film forming rate. RF power applied for sputtering a metal Al target was set to 500 W, while microwave power for forming the plasma was also set to 500 W. The $Al_xO_yN_z$ film formed under such conditions exhibited refractivity of 2.0 at a film forming rate of 1.5 Å/sec. and a wavelength of 633 nm.

Figure 7:
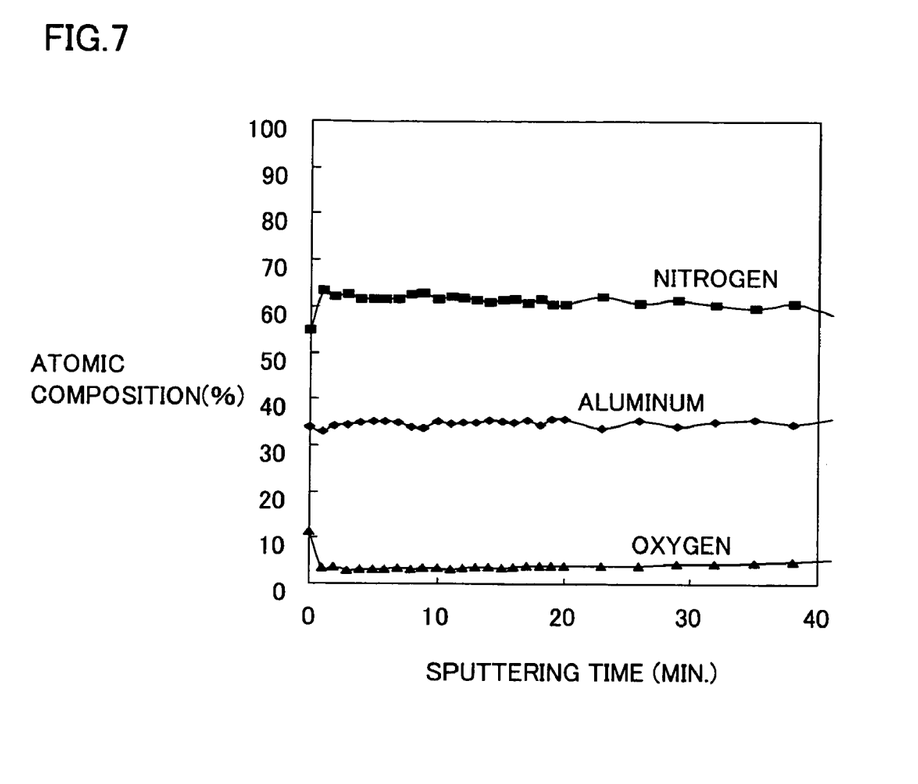
FIG. 7 is a graph showing the relation between a sputtering time and the atomic composition of a formed $Al_xO_yN_z$ film.

FIG. 7 is a graph showing the relation between the sputtering time and the atomic composition of the formed $Al_xO_yN_z$ film. As a result of analysis by AES (auger electron spectroscopy), it is understood from FIG. 7 that the $Al_xO_yN_z$ film has an atomic composition of x=0.348, y=0.038 and z=0.614 substantially homogeneous in the depth direction. A small quantity of Ar, not shown in FIG. 7, was also detected from the obtained $Al_xO_yN_z$ film.

Reflectivity of this semiconductor laser diode measured by the aforementioned method was 6%. The semiconductor laser diode according to Example 1 was preferable as a red semiconductor laser diode of the 650 nm band.

EXAMPLE 2

A semiconductor laser diode 1 according to Example 2 of the present invention similar to that according to the embodiment shown in FIGS. 1A and 1B was manufactured similarly to Example 1, except that first and second dielectric films 3 and 4 were prepared from $Al_2O_3$ (thickness: 6 nm) and $Al_xO_yN_z$ (thickness: 100 nm) respectively without formation of a third dielectric film. Reflectivity of this semiconductor laser diode measured similarly to Example 1 was 7%. The semiconductor laser diode according to Example 2 was also preferable as a red semiconductor laser diode of the 650 nm band.

EXAMPLE 3

A semiconductor laser diode 1' according to Example 3 of the present invention similar to that according to the embodiment shown in FIG. 6 was manufactured similarly to Example 1, except that first, second and third dielectric films 3, 4 and 8 were prepared from $Al_xO_yN_z$ (thickness: 20 nm) obtained by introducing 5% of nitrogen into $Al_2O_3$, $Al_xO_yN_z$ (thickness:

30 nm) having an oxygen content of 10% and $SiO_2$ respectively. Reflectivity of this semiconductor laser diode measured similarly to Example 1 was 8%. The semiconductor laser diode according to Example 3 was also preferable as a red semiconductor laser diode of the 650 nm band.

In the semiconductor laser diode according to Example 3, thermal conductivity on an interface was more improved as compared with the semiconductor laser diodes according to Examples 1 and 2 due to first dielectric film 3 of $Al_xO_yN_z$ prepared by introducing 5% of nitrogen into $Al_2O_3$ and second dielectric film 4 of $Al_xO_yN_z$ having the oxygen content of 10%. Thus, it was possible to prepare a semiconductor laser diode absolutely with no deterioration, with a COD level of 360 mW in CW (continuous-wave oscillation) and a COD level of 360 after aging with a pulse of 300 mW for 500 hours.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor laser diode comprising:
   a semiconductor substrate having an active layer with a pair of cavity facets opposed to each other on both ends of said active layer; and
   a first dielectric film of aluminum oxynitride having a nitrogen content of 1 to 10% and a second dielectric film of aluminum oxynitride having an oxygen content of 5 to 10% successively stacked on one of said cavity facets.

2. The semiconductor laser diode according to claim 1, wherein
   the thickness of said first dielectric film is 3 to 20 nm.

3. The semiconductor laser diode according to claim 1, wherein
   the thickness of said second dielectric film is 30 to 100 nm.

4. The semiconductor laser diode according to claim 1, further including a third dielectric film of an oxide stacked on said second dielectric film.

5. The semiconductor laser diode according to claim 4, wherein
   said third dielectric film is made of at least any material selected from aluminum oxide, silicon oxide, tantalum oxide, hafnium oxide, zirconium oxide, titanium oxide, niobium oxide, aluminum oxynitride, silicon oxynitride and silicon nitride.

6. The semiconductor laser diode according to claim 4, wherein
   the thickness of said third dielectric film is at least 20 nm.

7. The semiconductor laser diode according to claim 1, wherein
   said second dielectric film is made of an oxynitride prepared from a target of aluminum oxide ($Al_xO_y$, (0<x<1, 0<y<0.6)) in an ECR sputtering apparatus.

* * * * *